(12) United States Patent
Ohkoshi et al.

(10) Patent No.: US 11,539,141 B2
(45) Date of Patent: Dec. 27, 2022

(54) RADIO WAVE ABSORBER

(71) Applicants: THE UNIVERSITY OF TOKYO, Tokyo (JP); PANASONIC CORPORATION, Osaka (JP)

(72) Inventors: Shin-ichi Ohkoshi, Tokyo (JP); Asuka Namai, Tokyo (JP); Seiji Nishitani, Kyoto (JP); Tomohiro Kuzuu, Tokyo (JP)

(73) Assignees: PANASONIC HOLDINGS CORPORATION, Osaka (JP); THE UNIVERSITY OF TOKYO, Tokyo (JP)

( * ) Notice: Subject to any disclaimer, the term of this patent is extended or adjusted under 35 U.S.C. 154(b) by 342 days.

(21) Appl. No.: 16/626,181

(22) PCT Filed: Jun. 25, 2018

(86) PCT No.: PCT/JP2018/023949
§ 371 (c)(1),
(2) Date: Dec. 23, 2019

(87) PCT Pub. No.: WO2019/004104
PCT Pub. Date: Jan. 3, 2019

(65) Prior Publication Data
US 2021/0151895 A1   May 20, 2021

(30) Foreign Application Priority Data
Jun. 30, 2017 (JP) .............. JP2017-129752

(51) Int. Cl.
*H01Q 17/00* (2006.01)
*B32B 7/025* (2019.01)
(Continued)

(52) U.S. Cl.
CPC .......... *H01Q 17/004* (2013.01); *B32B 7/025* (2019.01); *B32B 9/00* (2013.01); *B32B 27/18* (2013.01); *C09D 5/032* (2013.01); *C09K 3/20* (2013.01)

(58) Field of Classification Search
CPC .. H01Q 17/004; B32B 9/00; B32B 7/00–7/14
See application file for complete search history.

(56) References Cited

U.S. PATENT DOCUMENTS

2004/0036559 A1   2/2004   Sue et al.
2010/0171066 A1   7/2010   Ohkoshi et al.
(Continued)

FOREIGN PATENT DOCUMENTS

JP   11289188 A  * 10/1999
JP   2004-022892    1/2004
(Continued)

OTHER PUBLICATIONS

Machine translation of JP11-289188. Retrieved Jan. 25, 2022.*
(Continued)

*Primary Examiner* — Prashant J Khatri
(74) *Attorney, Agent, or Firm* — Greenblum & Bernstein, P.L.C.

(57) ABSTRACT

A radio wave absorber includes a base member, and a radio wave absorption film formed on the base member. The radio wave absorption film includes at least MTC-substituted $\varepsilon\text{-}Fe_2O_3$ and black titanium oxide. The MTC-substituted $\varepsilon\text{-}Fe_2O_3$ is a crystal belonging to the same space group as an $\varepsilon\text{-}Fe_2O_3$ crystal and expressed by $\varepsilon\text{-}M_xTi_yCo_yFe_{2-2y-x}O_3$ where M is at least one element selected from the group consisting of Ga, In, Al, and Rh, $0<x<1$, and $0<y<1$.

15 Claims, 4 Drawing Sheets

(51) Int. Cl.
  *B32B 27/18*  (2006.01)
  *B32B 9/00*   (2006.01)
  *C09D 5/03*   (2006.01)
  *C09K 3/20*   (2006.01)

(56) References Cited

U.S. PATENT DOCUMENTS

2016/0164187 A1    6/2016  Ohokshi et al.
2017/0247524 A1 *  8/2017  Raffy ................... H05K 9/0083

FOREIGN PATENT DOCUMENTS

| JP | 2008150240 A * | 7/2008 | |
| JP | 2016-111341 | 6/2016 | |
| WO | 2008/149785 | 12/2008 | |
| WO | WO-2015145084 A1 * | 10/2015 | ............. H05K 1/162 |
| WO | 2017/043449 | 3/2017 | |

OTHER PUBLICATIONS

Machine translation of JP2008-150240. Retrieved Jan. 25, 2022.*
International Search Report issued in International Patent Application No. PCT/2018/023949, dated Sep. 11, 2018, along with an English translation thereof.

* cited by examiner

RADIO WAVE ABSORBER

CROSS-REFERENCE TO RELATED APPLICATIONS

This application is a National Stage of International Application No. PCT/JP2018/023949 filed Jun. 25, 2018, which claims priority to Japanese Patent Application No. 2017-129752 filed Jun. 30, 2017. The contents of each application are herein incorporated by reference in its entirety.

TECHNICAL FIELD

The present disclosure generally relates to a radio wave absorber, and more particularly relates to a radio wave absorber including a base member and a radio wave absorption film.

BACKGROUND ART

Recently, an increasing number of vehicles are equipped with a collision damage mitigation brake in order to detect any obstacle around them and avoid collision with the obstacle. As sensors for such a collision damage mitigation brake, a millimeter wave radar device, an infrared radar device, and an image recognition device using a camera have been known in the art Among other things, a millimeter wave radar device has attracted a lot of attention from the art, because the device of that type is hardly subject to the harmful effects of back lighting, rain, fog, or any other bad condition, and is effectively applicable to capturing an image even at night or even at the time of bad weather when the field of view is usually very narrow.

The millimeter wave radar device determines the location, relative velocity, direction, or any other parameter of the obstacle by mainly using, as a radio wave transmitted from a transmission antenna (hereinafter referred to as a "transmitted wave"), a radio wave falling within a 76 GHz band (which is equal to or greater than 76 GHz and equal to or less than 77 GHz) or a 79 GHz band (which is equal to or greater than 77 GHz and equal to or less than 81 GHz) and by making its reception antenna receive the radio wave reflected from the obstacle.

Nevertheless, the millimeter wave radar device has some drawbacks. For example, the transmitted wave may be internally reflected inside the millimeter wave radar device itself, and the reflected radio wave (hereinafter referred to as a "direct wave") may be directly received at the reception antenna. This could increase the chances of the millimeter wave radar device failing to detect pedestrians, because the radio waves reflected from pedestrians often have very low radio wave strength. Thus, to remove such a direct wave, there has been an increasing demand for a radio wave absorber that has a high return loss in a frequency band including a range from 76 GHz to 81 GHz.

Patent Document 1 discloses such a radio wave absorber. The radio wave absorber of Patent Document 1 includes a radio wave absorption film formed on a planar base member of aluminum and having a thickness of 220 μm to 230 μm. The radio wave absorber has peaks of radio wave absorption at 76 GHz, 78 GHz, and 79 GHz. The radio wave absorption film is made of ε-iron oxide, a carbon nanotube, barium titanate, a resin, and a dispersant. The ε-iron oxide is made up of $\varepsilon$-$Fe_2O_3$ crystals and crystals which have the same space group as the $\varepsilon$-$Fe_2O_3$ crystals and in which Ga is substituted for some Fe sites of the $\varepsilon$-$Fe_2O_3$ crystals. The ε-iron oxide is expressed by the formula $\varepsilon$-$Ga_{0.45}Fe_{1.55}O_3$. The radio wave absorption film of the radio wave absorber has a relative dielectric constant of 17.2 to 26.0.

However, in the radio wave absorber specifically disclosed in Patent Document 1, in its frequency band including a range from 76 GHz to 81 GHz, a frequency range in which the return loss is equal to or less than −10 dB has a bandwidth less than 7 GHz, and a frequency range in which the return loss is equal to or less than −15 dB has a bandwidth less than 2 GHz. Thus, in the known radio wave absorber, its frequency range with a high return loss might have too narrow a bandwidth to sufficiently remove the direct waves.

CITATION LIST

Patent Literature

Patent Document 1: JP 2016-111341 A

SUMMARY OF INVENTION

It is therefore an object of the present disclosure to provide a radio wave absorber, of which the frequency range with a high return loss has a sufficiently broad bandwidth in a frequency band including a range from 76 GHz to 81 GHz.

A radio wave absorber according to an aspect of the present disclosure includes a base member, and a radio wave absorption film formed on the base member. The radio wave absorption film includes at least MTC-substituted $\varepsilon$-$Fe_2O_3$ and black titanium oxide. The MTC-substituted $\varepsilon$-$Fe_2O_3$ is a crystal belonging to the same space group as an $\varepsilon$-$Fe_2O_3$ crystal and expressed by $\varepsilon$-$M_xTi_yCo_yFe_{2-2y-x}O_3$ where M is at least one element selected from the group consisting of Ga, In, Al, and Rh, $0<x<1$, and $0<y<1$.

DESCRIPTION OF EMBODIMENTS

[Radio Wave Absorber 1 According to First Embodiment]

Figure 1A:
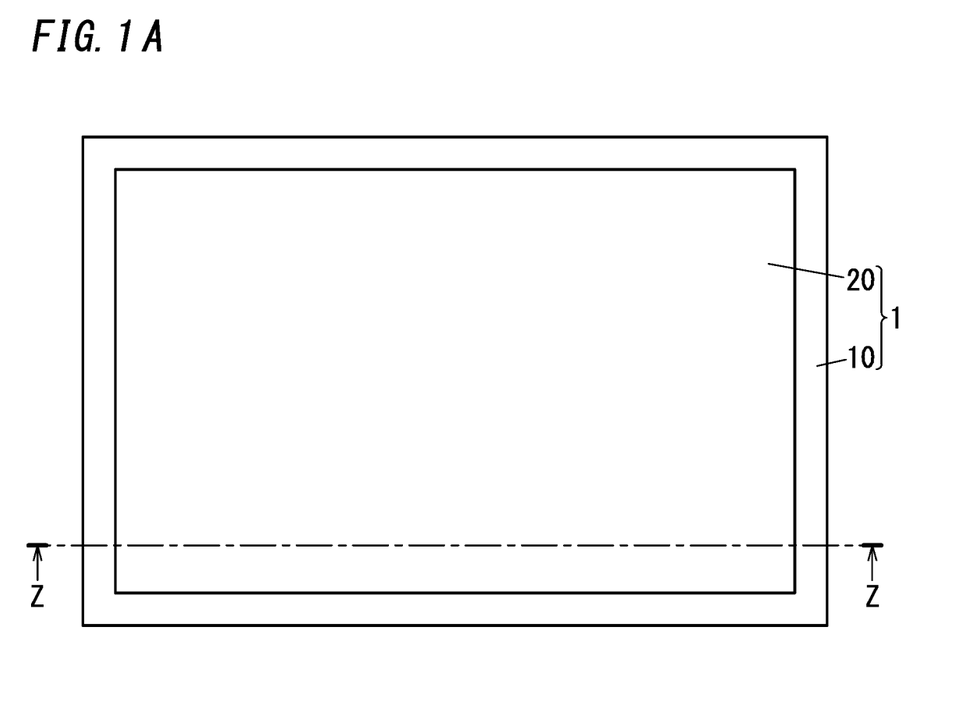
FIG. 1A is a schematic front view of a radio wave absorber according to a first embodiment of the present disclosure.
Figure 1B:
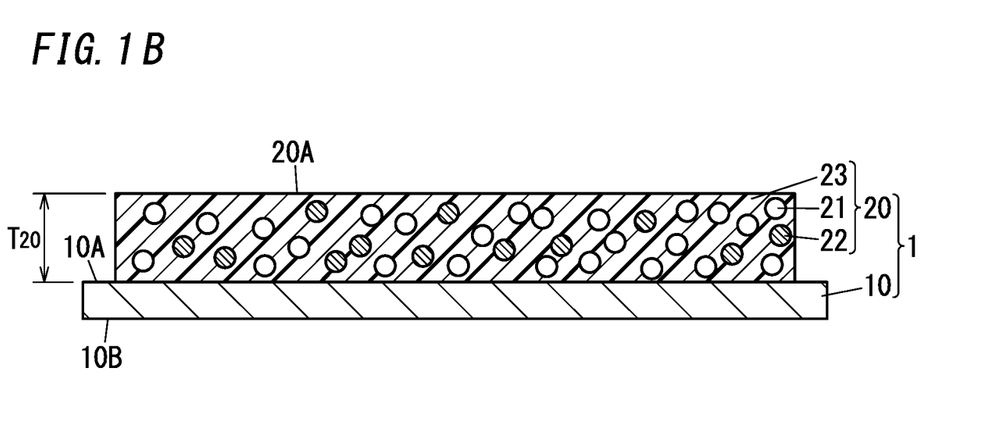
FIG. 1B is a schematic cross-sectional view of the radio wave absorber taken along the plane Z-Z shown in FIG. 1A.

FIG. 1A is a schematic front view of a radio wave absorber 1 according to a first exemplary embodiment (hereinafter sometimes referred to as a "first radio wave absorber 1"), and FIG. 1B is a schematic cross-sectional view of the first radio wave absorber 1 taken along the plane Z-Z shown in FIG. 1A.

The first radio wave absorber 1 is a single-layer radio wave absorber including a first base member 10 and a first radio wave absorption film 20 as shown in FIGS. 1A and 1B. The first radio wave absorption film 20 is formed on the first base member 10. The first base member 10 is made of an electron conductor. The radio wave absorption film 20 includes a plurality of MTC-substituted $\varepsilon$-Fe$_2$O$_3$ particles 21, a plurality of black titanium oxide particles 22, and a cured product 23 of a thermosetting resin. The plurality of MTC-substituted $\varepsilon$-Fe$_2$O$_3$ particles 21 and the plurality of black titanium oxide particles 22 are dispersed in the cured product 23 of the thermosetting resin. The MTC-substituted $\varepsilon$-Fe$_2$O$_3$ is a crystal belonging to the same space group as an $\varepsilon$-Fe$_2$O$_3$ crystal and expressed by the general formula $\varepsilon$-M$_x$Ti$_y$Co$_y$Fe$_{2-2y-x}$O$_3$ where M is at least one element selected from the group consisting of Ga, In, Al, and Rh, 0<x<1, and 0<y<1. As used herein, the "MTC-substituted $\varepsilon$-Fe$_2$O$_3$ particle 21" is a particle mainly composed of MTC-substituted $\varepsilon$-Fe$_2$O$_3$ crystals. The "plurality of black titanium oxide particles 22" are particles mainly composed of black titanium oxide crystals. The "black titanium oxide" refers herein to titanium suboxide lacking an oxygen atom with respect to TiO$_2$, and is expressed by the general formula TiO$_x$ (where 1≤x<2). The abundance ratio of crystals may be obtained by the Rietveld analysis based on an X-ray diffraction pattern.

The first radio wave absorber 1 has such a structure, and therefore, its frequency range with a high return loss has a broader bandwidth than a known one in a frequency band including a range from 76 GHz to 81 GHz. In other words, it is easier for the first radio wave absorber 1 to remove a radio wave falling within the range from 76 GHz to 81 GHz to say the least. Therefore, arranging the first radio wave absorber 1 inside a millimeter wave radar device (of which the transmitted wave has a frequency falling within either the 76 GHz band or the 79 GHz band) as will be described later allows redundant electromagnetic waves, such as the electromagnetic waves internally reflected inside the radar device, to be absorbed sufficiently for the millimeter wave radar device to detect pedestrians easily. As used herein, the frequency band including a range from 76 GHz to 81 GHz just needs to cover at least the range from 76 GHz through 81 GHz and is suitably a range from 65 GHz to 95 GHz. A method for measuring the return loss is the same as the method for measuring the return loss to be described later about specific examples.

In addition, the first radio wave absorber 1 has such a structure, and therefore, causes a radio wave with a frequency falling within the range from 65 GHz to 95 GHz to exhibit a lesser degree of dependence on the angle of incidence (hereinafter referred to as an "incident angle dependence"). The first radio wave absorber 1 has a peak of return loss in the range from 65 GHz to 95 GHz, and is able to maintain a high return loss in a sufficiently broad incident angle range. Specifically, the incident angle range in which the first radio wave absorber 1 has a return loss of −10 dB or less is at most 60 degrees in the cases of a transverse electric (TE) wave and a transverse magnetic (TM) wave. The incident angle range in which the first radio wave absorber 1 has a return loss of −15 dB or less is at most 50 degrees in the case of a TE wave and at most 45 degrees in the case of a TM wave.

The first radio wave absorber 1 has a peak of absorption at which the return loss becomes minimum (i.e., a peak of absorption at which the amount of radio waves absorbed becomes maximum) suitably in the range from 20 GHz to 300 GHz, more suitably in the range from 65 GHz to 95 GHz, and even more suitably in the range from 76 GHz to 81 GHz.

The bandwidth of the frequency range in which the first radio wave absorber 1 has a return loss of −10 dB or less is suitably as broad as possible. The narrowest possible bandwidth of the frequency range in which the first radio wave absorber 1 has a return loss of −10 dB or less is suitably 8 GHz and more suitably 10 GHz. In this case, if the first radio wave absorber 1 has a return loss of −10 dB or less in a plurality of discrete ranges, then the bandwidth of the frequency range in which the first radio wave absorber 1 has a return loss of −10 dB or less may be the sum of the respective bandwidths of those discrete ranges. For example, if the ranges in which the first radio wave absorber 1 has a return loss of −10 dB or less are a range from 65 GHz to 68 GHz and a range from 75 GHz to 80 GHz, then the total bandwidth of the frequency ranges in which the first radio wave absorber 1 has a return loss of −10 dB or less becomes 8 GHz.

The bandwidth of the frequency range in which the first radio wave absorber 1 has a return loss of −15 dB or less is suitably as broad as possible. The narrowest possible bandwidth of the frequency range in which the first radio wave absorber 1 has a return loss of −15 dB or less is suitably 4 GHz and more suitably 6 GHz. In this case, if the first radio wave absorber 1 has a return loss of −15 dB or less in a plurality of discrete ranges, then the bandwidth of the frequency range in which the first radio wave absorber 1 has a return loss of −15 dB or less may be the sum of the respective bandwidths of those discrete ranges.

{First Base Member 10}

The first radio wave absorber 1 includes the first base member 10. The first base member 10 supports the first radio wave absorption film 20.

The first base member 10 has the shape of a flat plate with a uniform thickness, and has a first surface 10A and a second surface 10B. The first surface 10A is a flat surface. On the first surface 10A, the first radio wave absorption film 20 is formed. The dimensions of the first base member 10 may be adjusted as appropriate according to the intended use of the first radio wave absorber 1, for example. The first base member 10 suitably has a thickness of 0.1 μm to 5 cm.

The first base member 10 is made of an electron conductor. This allows the first radio wave absorber 1 to have a greater return loss than a corresponding first radio wave absorber 1 having the same configuration as the former radio wave absorber 1 except that its first base member 10 is made of another material, not an electron conductor. This is presumably because of the following reasons. Specifically, when the first radio wave absorber 1 is irradiated with radio waves, some of the radio waves are reflected from the surface of the first radio wave absorption film 20 (such radio waves will be hereinafter referred to as "first reflected waves"), while the other radio waves propagate through the first radio wave absorption film 20, are attenuated by the MTC-substituted $\varepsilon$-Fe$_2$O$_3$ and the black titanium oxide, and then reach the surface of the first base member 10. The radio waves are totally reflected by an eddy current generated on the surface of the first base member 10 to propagate through the first radio wave absorption film 20 again while being attenuated and reach the surface of the first radio wave absorption film 20 all over again. Some of the radio waves are reflected from the surface of the first radio wave absorption film 20 to return to the inside of the first radio wave absorption film 20, while the other radio waves are radiated from the surface 20A of the first radio wave absorption film 20 (such radio waves will be hereinafter referred to as "second reflected waves"). After that, the radio waves will be reflected and attenuated over and over again inside the first radio wave absorption film 20. Controlling the thickness of the first radio wave absorption film 20 appropriately allows those reflected waves (including the first reflected waves, the second reflected waves, and so on) to interfere with, and cancel, each other. As can be seen, a high return loss is achievable by attenuating the radio waves through the repetitive reflections and attenuations inside the first radio wave absorption film 20 and letting the radio waves interfere with each other. A metal is suitably used as the electron conductor. Examples of suitable metals include aluminum, titanium, stainless steel (SUS), copper, brass, silver, gold, and platinum. As used herein, the "metal" refers to a substance with a resistivity (at 20° C.) of $10^{-4}$ Ω·m or less.

The first base member 10 has the first surface 10A with the shape of a flat plate. However, this is only an example and should not be construed as limiting. Alternatively, the shape of the first base member 10 may be adjusted appropriately according to the intended use of the first radio wave absorber 1, and may have a curved shape, for example, and the first surface 10A may have unevenness. In the latter case, raised portions of the unevenness may have a semicircular, semielliptical, triangular, rectangular, diamond, or hexagonal cross section, for example.

{First Radio Wave Absorption Film 20}

The first radio wave absorber 1 includes the first radio wave absorption film 20. The first radio wave absorption film 20 transforms part of the energy of the incident radio waves into thermal energy. That is to say, the first radio wave absorption film 20 absorbs the radio waves propagating through the first radio wave absorption film 20 itself. The first radio wave absorption film 20 is formed on the first surface 10A of the first base member 10.

The first radio wave absorption film 20 includes the plurality of MTC-substituted $\varepsilon$-Fe$_2$O$_3$ particles 21, the plurality of black titanium oxide particles 22, and the cured product 23 of the thermosetting resin. The plurality of MTC-substituted $\varepsilon$-Fe$_2$O$_3$ particles 21 and the plurality of black titanium oxide particles 22 are dispersed in the cured product 23 of the thermosetting resin.

The first radio wave absorption film 20 has a uniform thickness $T_{20}$. The first radio wave absorption film 20 has a flat surface 20A. The thickness $T_{20}$ of the first radio wave absorption film 20 may be adjusted as appropriate according to the frequency of the radio waves to absorb and the material of the first radio wave absorption film 20. In particular, the thickness $T_{20}$ of the first radio wave absorption film 20 is suitably the sum of one quarter of the wavelength of the radio waves to absorb when the radio waves propagate through the first radio wave absorption film 20 and a half of the wavelength multiplied by n, where n is an integer that is equal to or greater than zero, and suitably falls within the range from 0 to 3, and more suitably falls within the range from 0 to 1. In addition, adjusting the thickness $T_{20}$ of the first radio wave absorption film 20 allows the return loss of the first radio wave absorber 1, the frequency at which a peak of absorption appears, and the bandwidth of the frequency range with a high return loss to be controlled. The thickness $T_{20}$ of the first radio wave absorption film 20 may be obtained based on a cross-sectional TEM image, observed through a transmission electron microscope (TEM), of the first radio wave absorption film 20.

Setting the thickness $T_{20}$ of the first radio wave absorption film 20 at the sum of one quarter of the wavelength of the radio waves propagating through the first radio wave absorption film 20 and a half of the wavelength multiplied by n allows the radio waves reflected from the first surface IGA to be further reduced. This should be mainly because the radio waves reflected from the surface 20A and the radio waves reflected from the first surface IGA inside of the first radio wave absorption film 20 and emitted from the surface 20A (hereinafter referred to as "first internally reflected waves") would have mutually reverse phases, and therefore, would cancel each other by interfering with each other. The first internally reflected waves include not only first-order reflected waves reflected only once from the first surface 10A but also multi-reflected waves reflected twice or more from the first surface 10A.

The relative permeability of the first radio wave absorption film 20 has an imaginary part of suitably at least 0.01, more suitably 0.03 or more, at the resonant frequency of the MTC-substituted $\varepsilon$-Fe$_2$O$_3$. The relative dielectric constant of the first radio wave absorption film 20 is suitably at least equal to 3, more suitably 7 or more.

In the first radio wave absorber 1, the surface 20A of the first radio wave absorption film 20 is a flat surface. However, this is only an example and should not be construed as limiting. Alternatively, the surface 20A of the first radio wave absorption film 20 may have any other shape that allows the incident radio waves to enter the first radio wave absorption film 20 more easily, and may have the shape of a pyramid or a wedge, for example. Also, in the first radio wave absorber 1 illustrated in FIG. 1A, the first radio wave absorption film 20 does not cover the first surface 10A of the first base member 10 entirely. However, this is only an example and should not be construed as limiting. Alternatively, the first radio wave absorption film 20 may cover the first surface 10A entirely as well.

(MTC-Substituted $\varepsilon$-Fe$_2$O$_3$ Particles 21)

The first radio wave absorption film 20 contains the MTC-substituted $\varepsilon$-Fe$_2$O$_3$ particles 21 with one or more compositions. This allows the first radio wave absorber 1 to have a high return loss, of which the center frequency falls within the range from 30 GHz to 220 GHz. In particular, the first radio wave absorber 1 is able to have a broader absorption bandwidth than a known radio wave absorber containing $\varepsilon$-gallium iron oxide particles. For example, the frequency range in which the first radio wave absorber 1 has a return loss of −15 dB or less has as broad a bandwidth as 4 GHz or more and the frequency range in which the first radio wave absorber 1 has a return loss of −10 dB or less has as broad a bandwidth as 6 GHz or more.

The MTC-substituted $\varepsilon$-Fe$_2$O$_3$ is a crystal belonging to the same space group as an $\varepsilon$-Fe$_2$O$_3$ crystal and expressed by $\varepsilon$-M$_x$Ti$_y$Co$_y$Fe$_{2-2y-x}$O$_3$ where M is at least one element selected from the group consisting of Ga, In, Al, and Rh, $0<x<1$, $0<y<1$, and $2-2y-x>0$. That is to say, the MTC-substituted $\varepsilon$-Fe$_2$O$_3$ crystal is a crystal obtained by replacing some Fe sites of the $\varepsilon$-Fe$_2$O$_3$ crystal with an element M other than Fe, co-doping the $\varepsilon$-Fe$_2$O$_3$ crystal with Ti and Co, and then purifying the $\varepsilon$-Fe$_2$O$_3$ crystal. The MTC-substituted $\varepsilon$-Fe$_2$O$_3$ crystal is a crystal in which M ions, Ti ions, or Co ions are substituted for some Fe ions of the $\varepsilon$-Fe$_2$O$_3$ crystal.

Adjusting the amount of the substituent element M allows the frequency of a peak of absorption, at which the return loss of the first radio wave absorber 1 becomes minimum, to be controlled.

The plurality of the MTC-substituted $\varepsilon$-Fe$_2$O$_3$ particles 21 may either consist of particles with a single composition or include particles with multiple different compositions. The composition of the MTC-substituted $\varepsilon$-Fe$_2$O$_3$ particles 21 may be adjusted appropriately according to the frequency of the radio waves to absorb. For example, the MTC-substituted ε-$Fe_2O_3$ particles 21 may consist of only GTC type ε-$Fe_2O_3$ particles (where M is Ga) or may include at least one type of particles selected from the group consisting of GTC type ε-$Fe_2O_3$ particles (where M is Ga), ITC type ε-$Fe_2O_3$ particles (where M is In), ATC type ε-$Fe_2O_3$ particles (where M is Al), and RTC type ε-$Fe_2O_3$ particles (where M is Rh).

The MTC-substituted ε-$Fe_2O_3$ particles 21 have a spherical shape, which increases the ratio of the plurality of MTC-substituted ε-$Fe_2O_3$ particles 21 to the first radio wave absorption film 20.

The mean particle size of the MTC-substituted ε-$Fe_2O_3$ particles 21 is suitably large enough to allow the MTC-substituted ε-$Fe_2O_3$ particles 21 to have a single magnetic domain structure, and more specifically falls within the range from 5 nm to 200 nm, and even more suitably falls within the range from 10 nm to 100 nm. The mean particle size of the MTC-substituted ε-$Fe_2O_3$ particles 21 is obtained by observing a cross section of the first radio wave absorption film 20 through a transmission electron microscope (TEM) and calculating an area-based average value of the particle sizes of 10 or more MTC-substituted ε-$Fe_2O_3$ particles 21.

The content of the MTC-substituted ε-$Fe_2O_3$ particles 21 is suitably 5% to 70% by volume, more suitably 10% to 60% by volume, and even more suitably 10% to 40% by volume, of the overall volume of the first radio wave absorption film 20.

In the first radio wave absorber 1 described above, the MTC-substituted ε-$Fe_2O_3$ particles 21 have a spherical shape. However, this is only an example and should not be construed as limiting. Alternatively, the MTC-substituted 6-$Fe_2O_3$ particles 21 may have a rod shape, a compressed shape, or an irregular shape as well.

(Black Titanium Oxide Particles 22)

The first radio wave absorption film 20 contains a plurality of black titanium oxide particles 22. This allows the first radio wave absorber 1 to have a return loss of −15 dB or less in a broader frequency range than a corresponding first radio wave absorber 1 having the same configuration as the former radio wave absorber 1 except that the first radio wave absorption film 20 does not contain the black titanium oxide particles 22.

The relative dielectric constant of the black titanium oxide particles 22 at a frequency of 75 GHz or more is suitably at least equal to 10, more suitably 20 or more. This expands the bandwidth of the frequency range in which the first radio wave absorber 1 has a high return loss in the frequency band including a range from 76 GHz to 81 GHz.

As used herein, the black titanium oxide refers to titanium suboxide lacking an oxygen atom with respect to $TiO_2$. The lower limit value of x of the general formula $TiO_x$ (where 1≤x<2) is suitably at least equal to 1, more suitably 1.2 or more, and even more suitably 1.5 or more. The upper limit value of x is suitably less than 2, more suitably 1.9 or less, and even more suitably 1.85 or less. Specifically, examples of the black titanium oxide include TiO, $Ti_2O_3$, λ-$Ti_3O_5$, γ-$Ti_3O$, β-$Ti_3O_5$, $Ti_4O_7$, $Ti_5O_9$, and $Ti_6O_{11}$. Among other things, at least one compound selected from the group consisting of $Ti_4O_7$ and λ-$Ti_3O_5$ is suitably used in view of their high dielectric constant in the frequency range from 76 GHz to 81 GHz.

The black titanium oxide particles 22 have the shape of a coral with an uneven surface. This increases the ratio of the plurality of black titanium oxide particles 22 to the first radio wave absorption film 20.

The mean secondary particle size of the black titanium oxide particles 22 suitably falls within the range from 100 nm to 10 μm. As used herein, the mean secondary particle size of the black titanium oxide particles 22 is obtained by observing the shape of a power sample through a scanning electron microscope (SEM) and calculating the average value of the particle sizes based on the SEM image.

The blending ratio of the black titanium oxide particles 22 is suitably 5% to 70% by volume, more suitably 10% to 60% by volume, and even more suitably 10% to 40% by volume, of the overall volume of the first radio wave absorption film 20.

In the first radio wave absorber 1, the black titanium oxide particles 22 have a coral shape. However, this is only an example and should not be construed as limiting. Alternatively, the black titanium oxide particles 22 may have a spherical shape, a compressed shape, or an irregular shape as well.

(Cured Product 23 of Thermosetting Resin)

The first radio wave absorption film 20 contains the cured product 23 of the thermosetting resin. The cured product 23 of the thermosetting resin mainly serves as a binder for bonding the MTC-substituted ε-$Fe_2O_3$ particles 21 and the black titanium oxide particles 22 to the first base member 10.

The thermosetting resin may be any type of resin with the ability to bond the MTC-substituted ε-$Fe_2O_3$ and black titanium oxide to the first base member 10 by curing when heated. Examples of the thermosetting resins include epoxy resins, silicone resins, phenolic resins, polyimide resins, unsaturated polyester resins, polyvinyl ester resins, polyurethane resins, melamine resins, cyanate ester resins, isocyanate resins, polybenzoxazole resins, and modified resins thereof. Among them, the thermosetting resin is suitably at least one resin selected from the group consisting of epoxy resins, silicone resins, phenolic resins, and polyimide resins.

The blending ratio of the cured product 23 of the thermosetting resin is suitably 5% to 70% by volume, more suitably 10% to 60% by volume, and even more suitably 20% to 60% by volume, of the overall volume of the first radio wave absorption film 20.

In the first radio wave absorber 1, the first radio wave absorption film 20 contains the cured product 23 of the thermosetting resin. However, this is only an example and should not be construed as limiting. Rather the radio wave absorption film according to the present disclosure just needs to include the MTC-substituted ε-$Fe_2O_3$ and the black titanium oxide. For example, the radio wave absorption film may consist essentially of the MTC-substituted ε-$Fe_2O_3$ and the black titanium oxide, or may include not only the MTC-substituted ε-$Fe_2O_3$ and the black titanium oxide but also a ceramic or any other suitable component as will be described later.

(Additives)

The first radio wave absorption film 20 includes the plurality of MTC-substituted ε-$Fe_2O_3$ particles 21, the plurality of black titanium oxide particles 22, and the cured product 23 of the thermosetting resin. However, this is only an example and should not be construed as limiting. If necessary, the first radio wave absorption film 20 may contain an inorganic substance, an additive, or any other suitable ingredients as well. Examples of the inorganic substance include carbons and metal oxides. Examples of the carbons include carbon nanotubes, carbon micro-coils, and carbon black. Examples of the metal oxides include barium titanate, iron oxide, and strontium titanate. Examples of the additives include dispersants, colorants, antioxidants, photostabilizers, metal deactivators, flame retardants, and antistatic agents. Examples of the dispersants include silane coupling agents, titanate coupling agents, zirconate coupling agents, and aluminate coupling agents. These inorganic substances and the additives may have any shape such as a spherical, compressed, or fiber shape, for example. The blending ratio of the additive may be adjusted appropriately as far as the advantages of this embodiment are not neutralized.

[Implementation of Radio Wave Absorber 1 According to First Embodiment]

Figure 2:
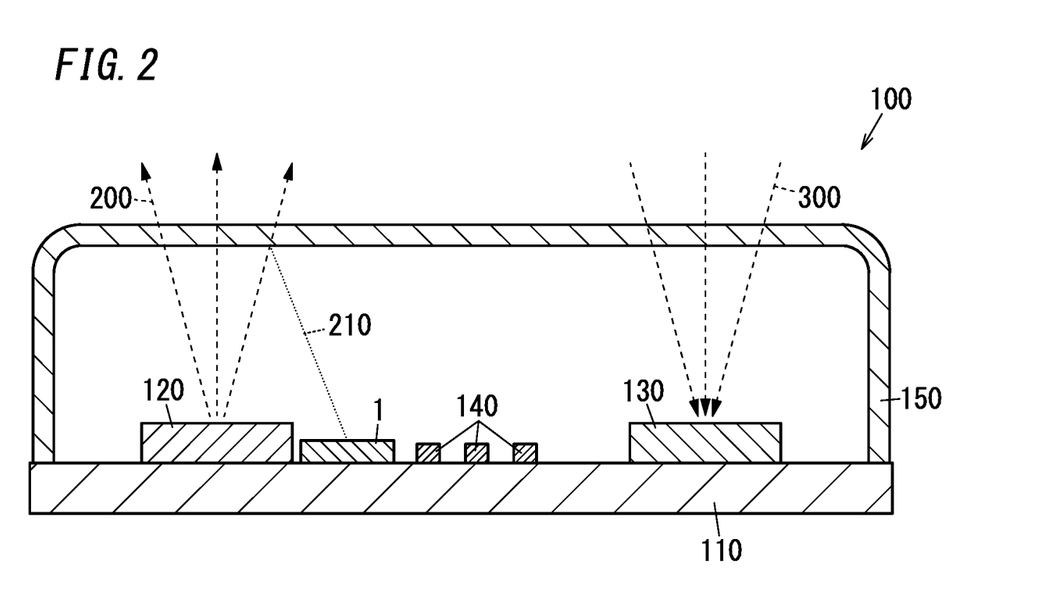
FIG. 2 is a schematic cross-sectional view illustrating a millimeter wave radar device as an exemplary application of the radio wave absorber according to the first embodiment of the present disclosure.

FIG. 2 is a schematic cross-sectional view of a millimeter wave radar device 100 according to a first implementation of the first radio wave absorber 1.

The first radio wave absorber 1 is suitably used to be arranged inside a millimeter wave radar device 100 as a piece of onboard equipment, for example.

As shown in FIG. 2, the millimeter wave radar device 100 includes a substrate 110, a transmission antenna 120, a reception antenna 130, a circuit 140, a radome 150, and the first radio wave absorber 1. The transmission antenna 120, the reception antenna 130, the circuit 140, and the first radio wave absorber 1 are arranged on the substrate 110. The circuit 140 is arranged between the transmission antenna 120 and the reception antenna 130 and located closer to the reception antenna 130. The first radio wave absorber 1 is arranged between the transmission antenna 120 and the reception antenna 130 and located closer to the transmission antenna 120. The radome 150 covers the transmission antenna 120 and the reception antenna 130.

The millimeter wave radar device 100 determines the location, relative velocity, direction, or any other parameter of the obstacle by transmitting radio waves 200 from the transmission antenna 120 (hereinafter referred to as "transmitted waves 200") and receiving the radio waves 300 reflected from the obstacle (hereinafter referred to as "received waves 300"). The radio waves 200 suitably include radio waves with a frequency falling within the range from 30 GHz to 300 GHz and particularly suitably fall within the 76 GHz band (from 76 GHz through 77 GHz) or the 79 GHz band (from 77 GHz through 81 GHz). Examples of the obstacles include other vehicles and pedestrians.

This millimeter wave radar device 100 allows some transmitted waves 210, reflected from the radome 150 (hereinafter referred to as "reflected waves 210"), out of the transmitted waves 200 emitted from the transmission antenna 120 to be absorbed into the first radio wave absorber 1. The first radio wave absorber 1 has a high return loss in a broader frequency range than known radio wave absorbers within the frequency band including a range from 76 GHz to 81 GHz, thus allowing the reflected waves 210 to reach the circuit 140 or the reception antenna 130 less easily than the known ones. This allows the millimeter wave radar device 100 to detect, with higher sensitivity, any surrounding pedestrians, from which the radio waves are reflected with low strength, and also reduces the chances of the circuit 140 operating erroneously.

[Method of Making First Radio Wave Absorber 1]

A method of making the first radio wave absorber 1 includes providing the first base member 10 and the first radio wave absorption film 20 separately and bonding the first base member 10 and the first radio wave absorption film 20 together. Another method of making the first radio wave absorber 1 includes providing the first base member 10, applying a composition as a material for the radio wave absorption film onto the first surface 10A of the first base member 10, and thermally curing the composition for the radio wave absorption film to form the first radio wave absorption film 20.

Exemplary methods of applying the composition for the radio wave absorption film include a spray coating method, a dip coating method, a roll coating method, a curtain coating method, a spin coating method, a screen printing method, a doctor blading method, and an applicator method. The composition for the radio wave absorption film may be thermally cured by heating the composition for the radio wave absorption film by a known method, for example.

The composition for the radio wave absorption film contains at least a powder of the MTC-substituted $\varepsilon$-$Fe_2O_3$ particles 21, a powder of the black titanium oxide particles 22, and the thermosetting resin described above, and has flowability that is high enough to allow the first radio wave absorption film 20 to have any desired thickness. The composition for the radio wave absorption film may contain a dispersion medium as needed.

Exemplary methods for adjusting the relative permeability of the first radio wave absorption film 20 thus obtained include adjusting the amount to be replaced by the substituent element M in the MTC-substituted $\varepsilon$-$Fe_2O_3$ and adjusting the content of the powder of the MTC-substituted $\varepsilon$-$Fe_2O_3$ particles 21 with respect to the first radio wave absorption film 20. An exemplary method for adjusting the relative dielectric constant of the first radio wave absorption film 20 thus obtained includes adjusting the content of the powder of the black titanium oxide particles 22.

<Powder of MTC-Substituted $\varepsilon$-$Fe_2O_3$ Particles 21>

The powder of the MTC-substituted $\varepsilon$-$Fe_2O_3$ particles 21 is a collection of the MTC-substituted $\varepsilon$-$Fe_2O_3$ particles 21. The mean particle size of the powder of the MTC-substituted $\varepsilon$-$Fe_2O_3$ particles 21 is suitably small enough to cause each particle 21 to have a single magnetic domain structure. The mean particle size of the powder of the MTC-substituted $\varepsilon$-$Fe_2O_3$ particles 21 suitably has an upper limit of 18 nm or less. The powder of the MTC-substituted $\varepsilon$-$Fe_2O_3$ particles 21 suitably has a lower limit of at least 10 nm, more suitably 15 nm or more. The mean particle size of the powder of the MTC-substituted $\varepsilon$-$Fe_2O_3$ particles 21, having a lower limit falling within the range specified above, reduces the chances of the magnetic properties per unit weight of the powder of the MTC-substituted $\varepsilon$-$Fe_2O_3$ particles 21 deteriorating. The mean particle size of the powder of the MTC-substituted $\varepsilon$-$Fe_2O_3$ particles 21 may be measured by the same method as the one to be described later for specific examples.

{Method of Making Powder of MTC-Substituted $\varepsilon$-$Fe_2O_3$ Particles 21}

An exemplary method of making a powder of the MTC-substituted $\varepsilon$-$Fe_2O_3$ particles 21 includes the steps of: (a1) obtaining a metal hydroxide by mixing an aqueous solution containing ferric ions such as iron (III) nitrate with a nitric acid aqueous solution containing a metallic element such as Ti, Co, or M as a substituent element and adding an alkali solution such as ammonia water to the mixture; (b1) obtaining a precursor powder by coating the metal hydroxide with a silicone oxide; (c1) obtaining a thermally treated powder by thermally treating the precursor powder in an oxidizing atmosphere; and (d1) subjecting the thermally treated powder to an etching process. In this method, these process steps (a1), (b1), (c1), and (d1) are performed in this order.

(Step (a1))

Step (a1) includes obtaining a metal hydroxide containing iron and a metallic element such as Ti, Co or M as a substituent element.

An exemplary method for obtaining a metal hydroxide containing iron and a metallic element as a substituent element includes: preparing a dispersion by mixing an iron (III) nitrate nonahydrate, a titanium (IV) sulfate n-hydrate, a cobalt (II) nitrate hexahydrate, and an M compound with pure water; and dripping ammonia aqueous solution into the dispersion and stirring up the mixture. This stirring step causes a metal hydroxide, containing iron and a metallic element such as Ti, Co, or M as a substituent element, to be produced.

As the M compound, for example, a gallium (III) nitrate n-hydrate may be used if M is Ga, an indium (III) nitrate n-hydrate may be used if M is In, an aluminum (III) nitrate n-hydrate may be used if M is Al, and a rhodium (III) nitrate n-hydrate may be used if M is Rh. The amounts of the iron (III) nitrate nonahydrate, the titanium (IV) sulfate n-hydrate, the cobalt (II) nitrate hexahydrate, and the M compound may be appropriately adjusted according to the desired composition of the MTC-substituted $\varepsilon$-$Fe_2O_3$.

The amount of the ammonia aqueous solution dripped suitably falls, when converted into ammonia, within the range from 3 moles to 30 moles per mole of the iron (III) nitrate. The temperature of the dispersion when the ammonia aqueous solution is dripped into the dispersion suitably falls within the range from 0° C. to 100° C., and more suitably falls within the range from 20° C. to 60° C.

(Step (b1))

Step (b1) includes obtaining a precursor powder by coating, with a silicone oxide, the iron (III) nitrate to which the metallic element has been applied. The precursor powder is a collection of particles of the iron (III) nitrate coated with the silicone oxide.

An exemplary method of coating, with the silicone oxide, the iron (III) nitrate to which the metallic element is applied includes, for example, dripping tetraethoxysilane (TEOS) into the dispersion to which the ammonia aqueous solution has been dripped, stirring up the mixture, and then allowing the mixture to cool to room temperature to perform separation treatment.

The amount of the TEOS dripped suitably falls within the range from 0.5 moles to 15 moles per mole of the iron (III) nitrate. The stirring is suitably performed for 15 to 30 hours. After the mixture has been allowed to cool, a predetermined amount of precipitant is suitably added thereto. As the precipitant, ammonium sulfate may be used, for example. An exemplary method of performing the separation treatment includes collecting solid matter by sucking and filtering the dispersion to which the TEOS has been dripped and then drying the solid matter thus collected. The drying temperature is suitably approximately 60° C.

(Step (c1))

Step (c1) includes obtaining a thermally treated powder by thermally treating the precursor powder in an oxidizing atmosphere. As the thermally treated powder, the MTC-substituted $\varepsilon$-$Fe_2O_3$ particles 21 coated with the silicone oxide are obtained.

The thermal treatment temperature suitably falls within the range from 900° C. to less than 1,200° C., and more suitably falls within the range from 950° C. to 1,150° C. The thermal treatment is suitably conducted for 0.5 to 10 hours, more suitably for 2 to 5 hours. Examples of the oxidizing atmospheres include an atmospheric-pressure atmosphere and a mixture of oxygen and nitrogen gases. Among other things, the atmospheric-pressure atmosphere is preferred out of cost and work efficiency considerations.

(Step (d1))

Step (d1) includes subjecting the thermally treated powder to an etching process, thus removing the silicone oxide from the thermally treated powder and obtaining a collection (powder) of the MTC-substituted $\varepsilon$-$Fe_2O_3$ particles 21.

An exemplary method of performing the etching process includes pulverizing the thermally treated powder described above, adding the pulverized powder to an aqueous solution of sodium hydroxide (NaOH), and stirring up the mixture. The liquid temperature of the aqueous solution of sodium hydroxide (NaOH) suitably falls within the range from 60° C. to 70° C. The aqueous solution of sodium hydroxide (NaOH) suitably has a concentration of about 5 M. The stirring is suitably performed for 15 to 30 hours.

<Powder of Black Titanium Oxide Particles 22>

The powder of the black titanium oxide particles 22 is a collection of the black titanium oxide particles 22. The mean secondary particle size of the powder of the black titanium oxide particles 22 suitably falls within the range from 100 nm to 10 μm. An exemplary method of measuring the mean secondary particle size of the powder of the black titanium oxide particles 22 may be the same as the method to be described later for specific examples.

{Method of Making Black Titanium Oxide Particles 22}

As the black titanium oxide particles 22, porous $Ti_4O_7$ particles are suitably used. An exemplary method of making the porous $Ti_4O_7$ particles includes, as step (a2), obtaining an aggregate by baking a powder of $TiO_2$ particles, for example, in a hydrogen atmosphere, and may also include, as step (b2), obtaining porous $Ti_4O_7$ particles by subjecting the aggregate to a pulverization process as needed.

(Step (a2))

Step (a2) includes obtaining an aggregate by baking a powder of $TiO_2$ particles in a hydrogen atmosphere. This baking step advances the reduction reaction of the $TiO_2$ particles, thus obtaining an aggregate of $Ti_4O_7$ ($Ti^{3+}_2 Ti^{4+}_2 O_7$), which is an oxide including $Ti^{3+}$.

The particle size of the $TiO_2$ particles is suitably 500 nm or less. Examples of the crystal structure of the $TiO_2$ particles include an anatase type and a rutile type. The flow rate of the hydrogen gas suitably falls within the range from 0.05 L/min to 0.5 L/min, and more suitably falls within the range from 0.1 L/min to 0.5 L/min. The baking temperature suitably falls within the range from 900° C. to 1,200° C., and more suitably falls within the range from 1,000° C. to 1,200° C. The baking temperature is suitably maintained for at most 10 hours, more suitably for 3 to 7 hours.

(Step (b2))

Step (b2) includes obtaining porous $Ti_4O_7$ particles by subjecting the aggregate to a pulverization process. This allows porous $Ti_4O_7$ particles with a desired particle size and a desired shape to be obtained.

Exemplary methods of performing the pulverization process include a ball mill method, a rod mill method, and a crushing pulverization method.

(Dispersion Medium)

Any appropriate dispersion medium may be prepared according to the material of a composition for the radio wave absorption film, for example. For example, water, an organic solvent, or an aqueous solution of an organic solvent may be used as the dispersion medium. Examples of the organic solvents include ketones, alcohols, ether alcohols, saturated aliphatic monocarboxylic acid alkyl esters, lactic acid esters, and ether-based esters. Any of these organic solvents may be used either by itself or in combination. Examples of the ketones include diethyl ketone and methyl butyl ketone. Examples of the alcohols include n-pentanol and 4-methyl-2-pentanol. Examples of the ether alcohols include ethylene glycol monomethyl ether and ethylene glycol monoethyl ether. Examples of the saturated aliphatic monocarboxylic acid alkyl esters include acetate-n-butyl and amyl acetate. Examples of the lactic acid esters include ethyl lactate and lactate-n-butyl. Examples of the ether esters include methyl cellosolve acetate and ethyl cellosolve acetate.

[Radio Wave Absorber 2 According to Second Embodiment]

Figure 3A:
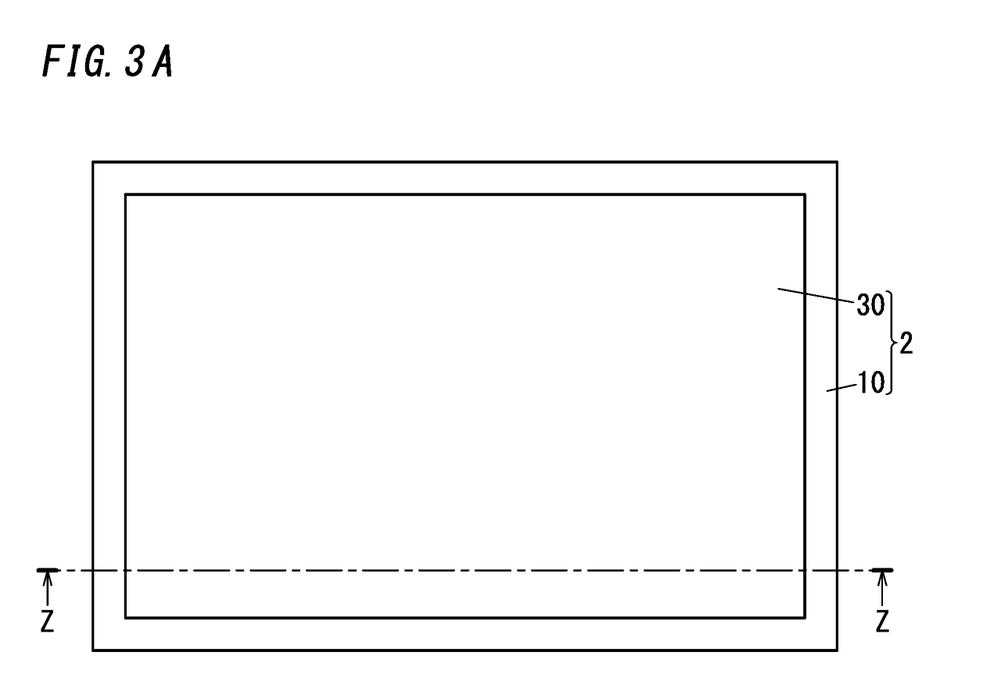
FIG. 3A is a schematic front view of a radio wave absorber according to a second embodiment of the present disclosure.
Figure 3B:
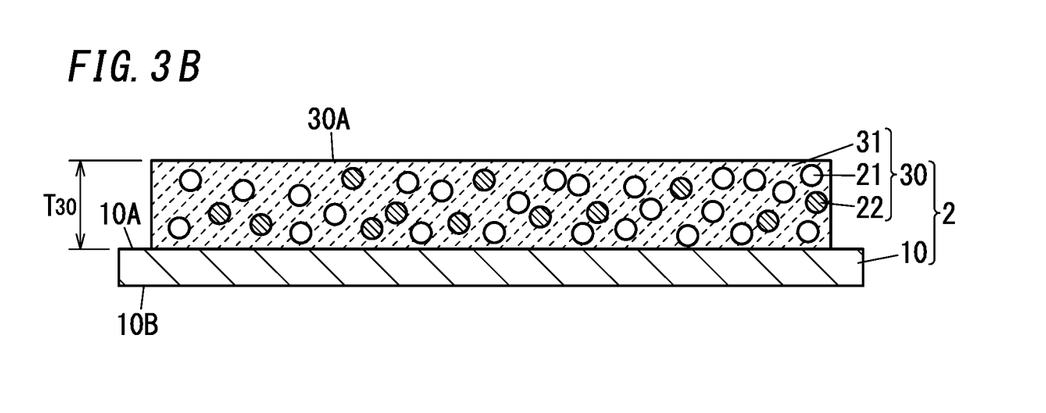
FIG. 3B is a schematic cross-sectional view of the radio wave absorber taken along the plane Z-Z shown in FIG. 3A.

FIG. 3A is a schematic front view of a radio wave absorber 2 according to a second exemplary embodiment (hereinafter sometimes referred to as a "second radio wave absorber 2"). FIG. 3B is a schematic cross-sectional view of the second radio wave absorber 2 taken along the plane Z-Z shown in FIG. 3A. In FIGS. 3A and 3B, any constituent element of this second radio wave absorber 2, having the same function as a counterpart of the first radio wave absorber 1 shown in FIGS. 1A and 1B, will be designated by the same reference numeral as that counterpart's, and description thereof will be omitted herein to avoid redundancies.

The second radio wave absorber 2 has the same structure as the first radio wave absorber 1 described above except that the second radio wave absorber 2 uses a ceramic 31 instead of the cured product 23 of the thermosetting resin.

As shown in FIGS. 3A and 3B, the second radio wave absorber 2 is a single layer radio wave absorber including the first base member 10 and a second radio wave absorption film 30. The second radio wave absorption film 30 is formed on the first base member 10. The second radio wave absorption film 30 includes the plurality of MTC-substituted $\varepsilon$-$Fe_2O_3$ particles 21, the plurality of black titanium oxide particles 22, and the ceramic 31.

The second radio wave absorber 2 is effectively usable as a tile building material, a paving material, or a siding (or wall cladding) material.

{Second Radio Wave Absorption Film 30}

The second radio wave absorber 2 includes the second radio wave absorption film 30. The second radio wave absorption film 30 transforms part of the energy of the incident radio waves into thermal energy. That is to say, the second radio wave absorption film 30 absorbs the radio waves propagating through the second radio wave absorption film 30 itself. The second radio wave absorption film 30 is formed on the first surface 10A of the first base member 10.

The second radio wave absorption film 30 includes the plurality of MTC-substituted $\varepsilon$-$Fe_2O_3$ particles 21, the plurality of black titanium oxide particles 22, and the ceramic 31. The plurality of MTC-substituted $\varepsilon$-$Fe_2O_3$ particles 21 and the plurality of black titanium oxide particles 22 are dispersed in the ceramic 31.

The second radio wave absorption film 30 has a uniform thickness. The second radio wave absorption film 30 has a flat surface 30A. The thickness $T_{30}$ of the second radio wave absorption film 30 may be adjusted as appropriate according to the frequency of the radio waves to absorb and the material of the second radio wave absorption film 30, for example, and suitably falls within the range from 10 μm o 10 mm, more suitably 100 μm to 2 mm. In particular, the thickness $T_{30}$ of the second radio wave absorption film 30 is suitably the sum of one quarter of the wavelength of the radio waves to absorb when the radio waves propagate through the second radio wave absorption film 30 and a half of the wavelength multiplied by n, where n is an integer that is equal to or greater than zero, and suitably falls within the range from 0 to 3, and more suitably falls within the range from 0 to 1. In addition, adjusting the thickness $T_{30}$ of the second radio wave absorption film 30 allows the return loss caused by the second radio wave absorber 2, the frequency at which a peak of absorption appears, and the bandwidth of the frequency range with a high return loss to be controlled. The thickness $T_{30}$ of the second radio wave absorption film 30 may be obtained based on a cross-sectional TEM image, observed through a transmission electron microscope (TEM), of the second radio wave absorption film 30.

Setting the thickness $T_{30}$ of the second radio wave absorption film 30 at the sum of one quarter of the wavelength of the radio waves propagating through the second radio wave absorption film 30 and a half of the wavelength multiplied by n allows the radio waves reflected from the first surface 10A to be further reduced. This should be mainly because the radio waves reflected from the surface 30A and the radio waves reflected from the first surface 10A inside of the second radio wave absorption film 30 and emitted from the surface 30A (hereinafter referred to as "second internally reflected waves") would have mutually reverse phases, and therefore, would cancel each other by interfering with each other. Thus, the second internally reflected waves include not only first-order reflected waves reflected only once from the first surface 10A but also multi-reflected waves reflected twice or more from the first surface 10A.

The relative permeability of the second radio wave absorption film 30 has an imaginary part of suitably at least 0.01, more suitably 0.03 or more, at the resonant frequency of the MTC-substituted $\varepsilon$-$Fe_2O_3$. The relative dielectric constant of the second radio wave absorption film 30 is suitably at least equal to 3, more suitably 7 or more.

In the second radio wave absorber 2, the surface 30A of the second radio wave absorption film 30 is a flat surface. However, this is only an example and should not be construed as limiting. Alternatively, the surface 30A of the second radio wave absorption film 30 may have any other shape that allows the incident radio waves to enter the second radio wave absorption film 30 more easily, and may have the shape of a pyramid or a wedge, for example. Also, in the second radio wave absorber 2 illustrated in FIG. 3A, the second radio wave absorption film 30 does not cover the first surface 10A of the first base member 10 entirely. However, this is only an example and should not be construed as limiting. Alternatively, the second radio wave absorption film 30 may entirely cover the first surface 10A of the first base member 10 as well.

The ceramic 31 may be made of any material with electrical insulation properties. Examples of the ceramic 31 materials include metal oxides, metal non-oxides, and glass. Among other things, an oxide is preferred in terms of thermal resistance, chemical resistance, and light stability. Examples of the metal oxide include $SiO_2$, $Al_2O_3$, and MgO. Examples of the metal non-oxides include SiC and $Si_3N_4$. Examples of the glass include crystallized glass, general purpose glass, low-melting glass, and non-oxide glass. The crystallized glass may be made of a $Li_2O_3$—$Al_2O_3$—$SiO_2$—MgO based material, an MgO—$Al_2O_3$—$SiO_2$ based material, or a CaO—$Al_2O_3$—$SiO_2$ based material, for example. The general-purpose glass may be silicate glass, soda lime glass, or borosilicate glass, for example. The low-melting glass may be borate glass or phosphate glass, for example. The non-oxide glass may be oxynitride glass, fluoride glass, or chalcogenide glass, for example.

EXAMPLES

Specific examples of the present disclosure will now be described. Note that these specific examples are only examples of the present disclosure and should not be construed as limiting.

[Analysis by Simulation of Return Loss]

First to Tenth Examples and First to Fifth Comparative Examples

The compositions and thicknesses and return losses with respect to the frequency of radio waves (falling within the range from 65 GHz to 100 GHz) shown in the following Table 1 were calculated by impedance matching based on the transmission theory. The "bandwidth (GHz) of frequency range where return loss≤−10 dB" and "bandwidth (GHz) of frequency range where return loss≤−15 dB" obtained based on the results of these simulations are shown in the following Table 1:

{Powder of MTC-Substituted ε-Fe₂O₃ Particles 21}

As a powder of MTC-substituted ε-Fe₂O₃ particles 21, an ε-iron oxide powder synthesized in the following manner was used.

First of all, a precursor powder was synthesized by sol-gel process. Specifically, 28 g of iron (III) nitrate nonahydrate, 0.69 g of titanium (IV) sulfate n-hydrate, 0.61 g of cobalt (II) hexahydrate, and 3.9 g of gallium (II) nitrate n-hydrate were weighed and put into a 1 L Erlenmeyer flask. At this time, the amounts of metals were changed such that the sum of the amount of the metals Fe+Ga+Ti+Co was adjusted to 64.0 mmol. The metal ratio was adjusted with the content of x set at 0.23 for $\varepsilon\text{-Ga}_x\text{Ti}_{0.05}\text{Co}_{0.05}\text{Fe}_{1.90-x}\text{O}_3$. First, 1,400 mL of pure water was added to an eggplant flask in which all of those metal salts had been introduced. Next, 57.2 mL of 25% ammonia aqueous solution was dripped at a rate of approximately one or more drops per second into the mixture while the mixture was being heated in an oil bus maintained at 30° C., and the mixture was kept stirred up for 30 minutes to

TABLE 1

| | Radio wave absorption film Composition (parts by volume) | | | | | | | | | Radio wave absorber | |
|---|---|---|---|---|---|---|---|---|---|---|---|
| | MTC-substituted ε-Fe₂O₃ particles (Ga) | G type ε-Fe₂O₃ particles | Ti₄O₇ particles | λ-Ti₃O₅ particles | CNT | Barium titanate | Air | Resin | Dispersant | Thickness (μm) | Bandwidth (GHz) of frequency range where return loss ≤ −10 dB | Bandwidth (GHz) of frequency range where return loss ≤ −15 dB |
| Ex. 1 | 21.0 | — | 34.3 | — | — | — | 44.7 | — | — | 232 | 22.6 | 11.7 |
| Ex. 2 | 30.0 | — | 10.0 | — | — | — | — | 60.0 | — | 826 | 11.5 | 5.9 |
| Ex. 3 | 30.0 | — | 10.0 | — | — | — | — | 60.0 | — | 928 | 14.4 | 5.9 |
| Ex. 4 | 30.0 | — | 10.0 | — | — | — | — | 60.0 | — | 1014 | 8 | 4.1 |
| Ex. 5 | 32.0 | — | 5.0 | — | — | — | — | 63.0 | — | 1020 | 13.1 | 8.9 |
| Ex. 6 | 30.0 | — | 25.0 | — | — | — | — | 45.0 | — | 240 | 20.7 | 10 |
| Ex. 7 | 10.0 | — | 30.0 | — | — | — | — | 60.0 | — | 238 | 20.5 | 5.4 |
| Ex. 8 | 35.0 | — | 5.0 | — | — | — | — | 60.0 | — | 1000 | 13.6 | 9.3 |
| Ex. 9 | 10.0 | — | — | 30.0 | — | — | — | 60.0 | — | 307 | 24.8 | 14 |
| Ex. 10 | 20.0 | — | — | 20.0 | — | — | — | 60.0 | — | 330 | 20.7 | 10 |
| Cmp. Ex. 1 | — | 68.0 | — | — | 2.0 | 1.4 | — | 23.8 | 4.8 | 230 | — | — |
| Cmp. Ex. 2 | — | 64.9 | — | — | 3.9 | 1.3 | — | 22.7 | 7.1 | 225 | — | — |
| Cmp. Ex. 3 | — | 66.2 | — | — | 4.0 | — | — | 23.2 | 6.6 | 220 | — | — |
| Cmp. Ex. 4 | 40.0 | — | — | — | — | — | — | 60.0 | — | 861 | 12.3 | 0.0 |
| Cmp. Ex. 5 | — | — | 40.0 | — | — | — | — | 60.0 | — | 826 | 5.2 | 0.6 |

[Actual Measurement of Return Loss]

First Example

A composition for a radio wave absorption film was obtained by mixing a powder of the MTC-substituted ε-Fe₂O₃ particles 21, a powder of the black titanium oxide particles 22, and the air such that these essential components had the respective parts by volume shown in Table 2. The composition for a radio wave absorption film had a solid content concentration of 41% by mass.

A substrate of aluminum was used as the first base member 10. This substrate had a thickness of 2 mm and had the shape of a flat plate with a uniform thickness. The first surface 10A was a flat surface.

A film of the composition thus prepared for a radio wave absorption film was applied as slits onto the first surface 10A of the first base member 10 to form an applied film. Next, the applied film was thermally cured to obtain a first radio wave absorption film 20. In this manner, a first radio wave absorber 1 was obtained.

co-precipitate a hydroxide. In this manner, a metal hydroxide containing iron and metallic elements Ga, Ti, and Co was obtained.

Thereafter, 52.8 mL of tetraethyl orthosilicate (TEOS) was dripped at a rate of approximately one or two drops per second into the dispersion in which the ammonia aqueous solution had been dripped, and the mixture was kept heated and stirred up for 20 hours, thereby producing silicon dioxide. After the mixture had been stirred up, the produced solid was filtered out through suction and filtering. The produced solid was then transferred to a petri dish and dried at 60° C. for one night to obtain a precursor powder.

The precursor powder thus obtained was then put into a crucible and baked at 1100° C. for 4 hours using an electric furnace within an atmospheric-pressure atmosphere, thus obtaining a thermally treated powder. At this time, the temperature was raised at a rate of 4 K/min and lowered at a rate of 5 K/min. The respective particles of the thermally treated powder were covered with the silicon dioxide.

Next, a 3M NaOH aqueous solution was added to the thermally treated powder thus obtained and the mixture was kept heated and stirred up for 24 hours in an oil bus at 65° C., thereby removing the silicon dioxide. Thereafter, the supernatant was removed by centrifugal separation and the solid thus obtained was dried for one night to obtain an ε-iron oxide powder.

The ε-iron oxide powder thus obtained was subjected to an element analysis using an RF inductively coupled plasma (ICP) spectrometer Agilent 7700x (manufactured by Agilent Technology). The result of the element analysis revealed that Ga:Ti:Co:Fe=0.23:0.05:0.05:1.67. That is to say, the ε-iron oxide powder thus obtained turned out to be a powder of ε-$Ga_{0.23}Ti_{0.05}Co_{0.05}Fe_{1.67}O_3$ particles (hereinafter referred to as "GTC type ε-$Fe_2O_3$ particles").

A 1,000,000× photograph of the ε-iron oxide powder thus obtained was shot through a transmission electron microscope JEM2000EX (manufactured by JEOL Ltd.) to observe the shape of the respective particles. As a result, it was confirmed that the particles had a spherical shape. In addition, based on this photograph, the longest axis size and shortest axis size of respective particles of the ε-iron oxide powder were measured and their average was calculated to obtain a particle size. The average of the particle sizes (i.e., the mean particle size) of at least 100 independent particles of the ε-iron oxide powder was approximately 30 nm.

{Powder of Black Titanium Oxide Particles 22}

As a powder of the black titanium oxide particles 22, a black titanium oxide powder synthesized in the following manner was used.

A powder of $TiO_2$ particles (with a mean particle size of 7 nm and an anatase crystal structure) was baked in a hydrogen atmosphere to obtain an aggregate. The flow rate of the hydrogen gas was 0.3 L/min. The baking temperature was 1,000° C., which was maintained for 5 hours. In this manner, a black titanium oxide powder was obtained.

An X-ray diffraction (XRD) pattern of the black titanium oxide powder thus obtained was analyzed. The result of the analysis revealed that 99% of $Ti_4O_7$ was generated and 1% of $Ti_3O_5$ was generated in the black titanium oxide powder thus obtained.

Second to Fourth Examples

A first radio wave absorber 1 was obtained in the same way as in the first example except that an applied film was formed, using an epoxy resin YX4000H (manufactured by Mitsubishi Chemical Corporation) instead of the air, on the first surface 10A of the first base member 10 such that the first radio wave absorption film 20 had the thickness $T_{20}$ shown in Table 2.

First to Third Comparative Examples

A powder of G-type ε-$Fe_2O_3$ particles, a carbon nanotube (CNT), barium titanate particles, a resin, and a dispersant were added to Terpineol so as to have the composition shown in Table 2 and the respective components were uniformly dissolved or dispersed to obtain film forming paste. The solid content concentration of the film forming paste was adjusted to 40% by mass.

As the powder of G-type ε-$Fe_2O_3$ particles, a powder of ε-$Ga_{0.45}Fe_{1.55}O_3$ particles was used. The powder had a mean particle size falling within the range from 20 nm to 30 nm. As the carbon nanotube (CNT), a multilayer carbon nanotube with a major axis size of 150 nm was used. The barium titanate particles had a mean particle size of 10 nm. As the resin, cellulose (methyl cellulose) was used. As the dispersant, a 1:1 (by mass) mixture of di(isopropyloxy)di(isostearoyloxy) titanium and vinyltrimethoxy silane was used.

The film forming paste was applied in the form of slits onto the first base member 10 to form an applied film thereon. The thickness of the applied film was adjusted such that the radio wave absorption film had the thickness shown in Table 2. Next, the coating film thus formed was dried to obtain a radio wave absorber. The radio wave absorbers representing the first to third comparative examples respectively correspond to the radio wave absorbers representing the first to third examples of Patent Document 1.

{Measurement of Return Loss}

First Example and First to Third Comparative Examples

Figure 4:
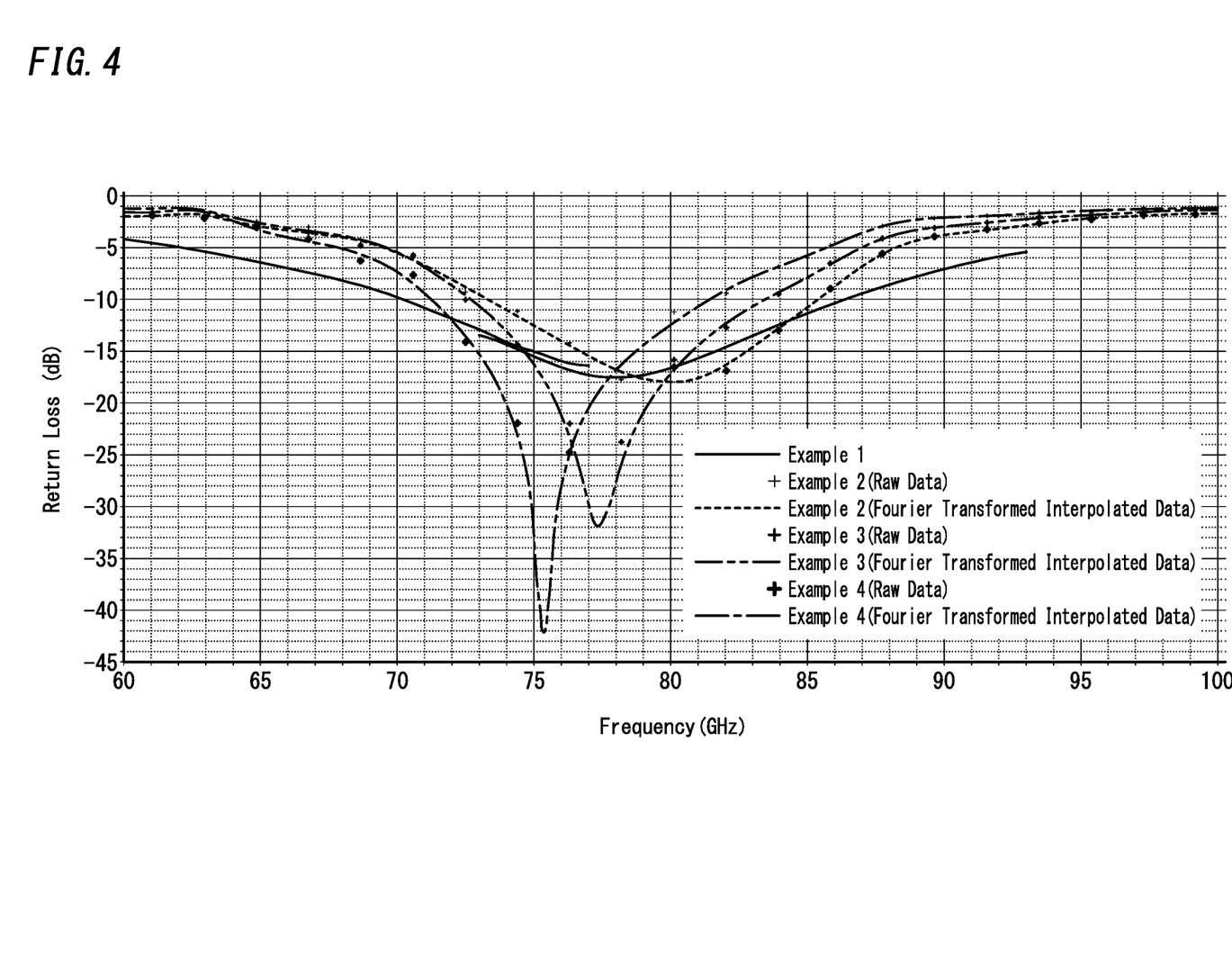
FIG. 4 is a graph showing how the return loss changes with the frequency of a radio wave in radio wave absorbers according to first to fourth examples.

The radio wave absorber thus obtained had a return loss, caused by itself at a frequency falling within the range from 60 GHz to 93 GHz, measured by the free space method using a vector network analyzer. The result of measurement for the first example is shown in FIG. 4.

Second to Fourth Examples

The first radio wave absorber 1 thus obtained had a return loss, caused by itself at a frequency falling within the range from 50 GHz to 100 GHz, measured by the terahertz spectroscopy using a terahertz time domain spectrometer TAS7400TS (manufactured by Advantest Corporation). Specifically, the first radio wave absorber 1 was irradiated with pulsed terahertz waves, and the time waveform of the reflected pulsed terahertz waves was measured and subjected to Fourier transform to evaluate the wavelength dependence of the return loss. The interval between data points was interpolated by subjecting the results of measurement thus obtained for the second to fourth examples to Fourier transform correction processing. The results of measurement for the second to fourth examples and data obtained by subjecting the results of measurement for the second to fourth examples to the Fourier transform correction processing are shown in FIG. 4.

TABLE 2

| | Radio wave absorption film | | | | | | |
|---|---|---|---|---|---|---|---|
| | Composition (parts by volume) | | | | | | |
| | MTC-substituted ε-$Fe_2O_3$ particles (Ga) | G type ε-$Fe_2O_3$ particles | $Ti_4O_7$ particles | CNT | Barium titanate | Air | Resin |
| Ex. 1 | 21.0 | — | 34.3 | — | — | 44.7 | — |
| Ex. 2 | 30.0 | — | 10.0 | — | — | — | 60.0 |

TABLE 2-continued

| | | | | | | |
|---|---|---|---|---|---|---|
| Ex. 3 | 30.0 | — | 10.0 | — | — | 60.0 |
| Ex. 4 | 30.0 | — | 10.0 | — | — | 60.0 |
| Cmp. Ex. 1 | — | 68.0 | — | 2.0 | 1.4 | — | 23.8 |
| Cmp. Ex. 2 | — | 64.9 | — | 3.9 | 1.3 | — | 22.7 |
| Cmp. Ex. 3 | — | 66.2 | — | 4.0 | — | — | 23.2 |

| | Radio wave absorption film | | Radio wave absorber | | |
|---|---|---|---|---|---|
| | Composition (parts by volume) Dispersant | Thickness (μm) | Bandwidth (GHz) of frequency range where return loss ≤ −10 dB | Bandwidth (GHz) of frequency range where return loss ≤ −15 dB | Measurement method |
| Ex. 1 | — | 232 | 16 | 7 | Free space |
| Ex. 2 | — | 826 | 12 | 6 | Terahertz spectroscopy |
| Ex. 3 | — | 928 | 10 | 6 | Terahertz spectroscopy |
| Ex. 4 | — | 1014 | 10 | 6 | Terahertz spectroscopy |
| Cmp. Ex. 1 | 4.8 | 230 | 0 | 0 | Free space |
| Cmp. Ex. 2 | 7.1 | 225 | 2 | 0 | Free space |
| Cmp. Ex. 3 | 6.6 | 220 | 7 | 1 | Free space |

{Analysis by Simulation of Incident Angle Dependence of Return Loss}

First to Fourth Examples and Fourth and Fifth Comparative Examples

The return loss with respect to each radio wave frequency (falling within the range from 65 GHz to 100 GHz) was calculated for each of the compositions and thicknesses shown in the following Table 3, the angles of incidence of the radio waves onto the surface of the radio wave absorption film, and settings of the angles of incidence by impedance matching based on the transmission theory. The "incident angle range (°) where return loss ≤−10 dB at peak value of 0° return loss" and "incident angle range (°) where return loss ≤−15 dB at peak value of 0° return loss" are shown in the following Table 3. Note that each of the angles shown in It can be seen that in each of the examples, a peak of return loss was observed within the frequency range from 65 GHz to 95 GHz, and a high return loss could be maintained because the incident angle range where return loss ≤−10 dB was at most 60 degrees in the cases of both transverse electric (TE) waves and transverse magnetic (TM) waves and because the incident angle range where return loss ≤−15 dB was at most 50 degrees in the case of TE waves and at most 45 degrees in the case of TM waves. Thus, it can be seen that the incident angle dependence is reducible by adopting the examples.

Note that in the fourth comparative example, a return loss of −15 dB or less was not observed at any peak of the 0° return loss, and therefore, its performance could not be evaluated.

TABLE 3

| | Radio wave absorption film | | | | | Radio wave absorber | | | | | |
|---|---|---|---|---|---|---|---|---|---|---|---|
| | Composition (parts by volume) | | | | | Incident angle range (°) where return loss ≤ −10 dB at peak value of 0° return loss | | | Incident angle range (°) where return loss ≤ −15 dB at peak value of 0° return loss | | |
| | MTC-substituted ε-Fe$_2$O$_3$ particles | Ti$_4$O$_7$ particles | Air | Resin | Thickness (μm) | Average for TE and TM waves | TE wave | TM wave | Average for TE and TM waves | TE wave | TM wave |
| Ex. 1 | 21.0 | 34.3 | 44.7 | | 232 | 0°-60° | 0°-60° | 0°-50° | 0°-45° | 0°-50° | 0°-30° |
| Ex. 2 | 30.0 | 10.0 | — | 60.0 | 826 | 0°-50° | 0°-45° | 0°-50° | 0°-30° | 0°-40° | 0°-40° |
| Ex. 3 | 30.0 | 10.0 | — | 60.0 | 928 | 0°-50° | 0°-40° | 0°-60° | 0°-30° | 0°-20° | 0°-45° |
| Ex. 4 | 30.0 | 10.0 | — | 60.0 | 1014 | 0°-50° | 0°-50° | 0°-50° | 0°-30° | 0°-30° | 0°-30° |
| Cmp. Ex. 4 | 40.0 | — | — | 60.0 | 861 | 0°-50° | 0°-30° | 0°-30° | x | x | x |
| Cmp. Ex. 5 | — | 40.0 | — | 60.0 | 826 | 0°-45° | 0°-45° | 0°-30° | x | 0°-30° | x |

Table 3 means the angle of incidence of the radio waves onto the surface of the radio wave absorption film and that the direction perpendicular to the surface of the radio wave absorption film is supposed to be zero degrees. Also, in the "incident angle range(°) where return loss ≤−10 dB at peak value of 0° return loss" shown in Table 3, "0°-60°" means that when the angle of incidence was larger than 60°, the return loss was greater than −10 dB within the frequency range of the radio waves.

REFERENCE SIGNS LIST 1,2 Radio Wave Absorber
Base Member
20,30 Radio Wave Absorption Film
21 MTC-Substituted ε-Fe$_2$O$_3$ Particle
22 Black Titanium Oxide Particle
23 Cured Product of Thermosetting Resin
31 Ceramic 100 Millimeter Wave Radar Device
110 Substrate
120 Transmission Antenna
130 Reception Antenna
140 Circuit
150 Radome
200 Transmitted Wave
210 Reflected Wave
300 Received Wave

The invention claimed is:

1. A radio wave absorber comprising:
a base member; and
a radio wave absorption film formed on the base member,
the radio wave absorption film including at least MTC-substituted $\varepsilon$-$Fe_2O_3$ and black titanium oxide,
the MTC-substituted $\varepsilon$-$Fe_2O_3$ being a crystal belonging to the same space group as an $\varepsilon$-$Fe_2O_3$ crystal and expressed by $\varepsilon$-$M_xTi_yCo_yFe_{2-2y-x}O_3$ where M is at least one element selected from the group consisting of Ga, In, Al, and Rh, $0<x<1$, and $0<y<1$; and
a blending ratio of the black titanium oxide being 5% to 40% by volume of an overall volume of the ratio wave absorption film.

2. The radio wave absorber of claim 1, wherein the black titanium oxide includes at least one compound selected from the group consisting of $Ti_4O_7$ and $\lambda$-$Ti_3O_5$.

3. The radio wave absorber of claim 1, wherein the radio wave absorption film further includes a cured product of a thermosetting resin.

4. The radio wave absorber of claim 3, wherein the thermosetting resin includes at least one resin selected from the group consisting of epoxy resins, silicone resins, phenolic resins, and polyimide resins.

5. The radio wave absorber of claim 1, wherein the radio wave absorption film further includes a ceramic.

6. The radio wave absorber of claim 5, wherein the ceramic is made of a metal oxide.

7. The radio wave absorber of claim 2, wherein the radio wave absorption film further includes a cured product of a thermosetting resin.

8. The radio wave absorber of claim 7, wherein the thermosetting resin includes at least one resin selected from the group consisting of epoxy resins, silicone resins, phenolic resins, and polyimide resins.

9. The radio wave absorber of claim 2, wherein the radio wave absorption film further includes a ceramic.

10. The radio wave absorber of claim 9, wherein the ceramic is made of a metal oxide.

11. A radio wave absorber comprising:
a base member; and
a radio wave absorption film formed on the base member,
the radio wave absorption film including at least MTC-substituted $\varepsilon$-$Fe_2O_3$ and black titanium oxide,
the MTC-substituted $\varepsilon$-$Fe_2O_3$ being a crystal belonging to the same space group as an $\varepsilon$-$Fe_2O_3$ crystal and expressed by $\varepsilon$-$M_xTi_yCo_yFe_{2-2y-x}O_3$ where M is at least one element selected from the group consisting of Ga, In, Al, and Rh, $0<x<1$, and $0<y<1$, and
the black titanium oxide includes at least one compound selected from the group consisting of $Ti_4O_7$ and $\lambda$-$Ti_3O_5$.

12. The radio wave absorber of claim 11, wherein the radio wave absorption film further includes a cured product of a thermosetting resin.

13. The radio wave absorber of claim 12, wherein the thermosetting resin includes at least one resin selected from the group consisting of epoxy resins, silicone resins, phenolic resins, and polyimide resins.

14. The radio wave absorber of claim 11, wherein the radio wave absorption film further includes a ceramic.

15. The radio wave absorber of claim 14, wherein the ceramic is made of a metal oxide.

* * * * *